(12) United States Patent
Richter et al.

(10) Patent No.: US 7,955,962 B2
(45) Date of Patent: Jun. 7, 2011

(54) METHOD OF REDUCING CONTAMINATION BY PROVIDING A REMOVABLE POLYMER PROTECTION FILM DURING MICROSTRUCTURE PROCESSING

(75) Inventors: Ralf Richter, Dresden (DE); Frank Feustel, Dresden (DE); Thomas Werner, Moritzburg (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 101 days.

(21) Appl. No.: 11/695,657

(22) Filed: Apr. 3, 2007

(65) Prior Publication Data

US 2008/0026492 A1    Jan. 31, 2008

(30) Foreign Application Priority Data

Jul. 31, 2006    (DE) .......................... 10 2006 035 644

(51) Int. Cl.
*H01L 21/20* (2006.01)

(52) U.S. Cl. ... 438/584; 438/17; 438/759; 257/E21.487; 257/E21.521

(58) Field of Classification Search .................. 438/584, 438/17
See application file for complete search history.

(56) References Cited

U.S. PATENT DOCUMENTS

| | | | | |
|---|---|---|---|---|
| 4,732,642 A * | 3/1988 | Ametani | ........................ | 156/497 |
| 4,814,015 A * | 3/1989 | Quinlan | .................... | 106/169.43 |
| 4,828,640 A * | 5/1989 | Kaya et al. | ...................... | 156/248 |
| 5,099,305 A * | 3/1992 | Takenaka | ........................ | 257/295 |
| 5,298,720 A * | 3/1994 | Cuomo et al. | ............ | 219/121.43 |
| 5,731,229 A * | 3/1998 | Kato et al. | ........................ | 438/50 |
| 5,874,319 A * | 2/1999 | Dunaway et al. | ................ | 438/17 |
| 5,945,349 A * | 8/1999 | Koo | ................ | 438/694 |
| 6,083,811 A * | 7/2000 | Riding et al. | .................. | 438/460 |
| 6,251,502 B1 * | 6/2001 | Yasue et al. | ..................... | 428/209 |
| 6,276,997 B1 * | 8/2001 | Li | .................................... | 451/41 |
| 6,288,357 B1 * | 9/2001 | Dyer | ...................... | 219/121.41 |
| 6,338,980 B1 * | 1/2002 | Satoh | ........................... | 438/106 |
| 6,503,130 B2 * | 1/2003 | Lim | ................................. | 451/285 |
| 6,596,042 B1 * | 7/2003 | Feng et al. | ......................... | 51/309 |
| 6,645,782 B1 * | 11/2003 | Kontic | ............................. | 438/16 |
| 6,710,260 B1 * | 3/2004 | Seki et al. | ..................... | 174/258 |
| 6,787,480 B2 * | 9/2004 | Aoki et al. | ..................... | 438/775 |
| 6,794,751 B2 * | 9/2004 | Kumamoto | ................... | 257/738 |
| 6,875,468 B2 * | 4/2005 | Kunz et al. | ............... | 427/255.28 |
| 6,881,611 B1 * | 4/2005 | Fukasawa et al. | ............. | 438/114 |
| 6,902,941 B2 * | 6/2005 | Sun | ................................ | 438/17 |
| 6,951,769 B2 * | 10/2005 | Malone | ............................ | 438/51 |
| 6,992,006 B2 * | 1/2006 | Otsuka et al. | ................. | 438/687 |
| 7,026,233 B2 * | 4/2006 | Cheng et al. | .................. | 438/612 |
| 7,060,593 B2 * | 6/2006 | Kurosawa et al. | ............. | 438/464 |
| 7,132,732 B2 * | 11/2006 | Ohto et al. | ..................... | 257/637 |

(Continued)

FOREIGN PATENT DOCUMENTS

DE    698 29 986 T2    2/2006

(Continued)

*Primary Examiner* — N Drew Richards
*Assistant Examiner* — Ankush k Singal
(74) *Attorney, Agent, or Firm* — Williams, Morgan & Amerson, P.C.

(57) ABSTRACT

By providing a protective layer in an intermediate manufacturing stage, an increased surface protection with respect to particle contamination and surface corrosion may be achieved. In some illustrative embodiments, the protective layer may be used during an electrical test procedure, in which respective contact portions are contacted through the protective layer, thereby significantly reducing particle contamination during a respective measurement process.

24 Claims, 3 Drawing Sheets

U.S. PATENT DOCUMENTS

| | | | | |
|---|---|---|---|---|
| 7,178,236 | B2* | 2/2007 | Gleason et al. | 29/874 |
| 7,235,426 | B2* | 6/2007 | Tsai | 438/113 |
| 7,306,695 | B2* | 12/2007 | Kasai | 156/344 |
| 7,482,249 | B2* | 1/2009 | Jakob et al. | 438/460 |
| 7,572,725 | B2* | 8/2009 | Storli | 438/612 |
| 7,749,349 | B2* | 7/2010 | Pratt et al. | 156/248 |
| 2002/0137309 | A1* | 9/2002 | Senoo et al. | 438/460 |
| 2003/0129846 | A1* | 7/2003 | Liu et al. | 438/698 |
| 2003/0201724 | A1* | 10/2003 | Lagos | 315/111.81 |
| 2003/0211814 | A1* | 11/2003 | Shih et al. | 451/36 |
| 2004/0038498 | A1* | 2/2004 | Ozono et al. | 438/464 |
| 2005/0003636 | A1* | 1/2005 | Takyu et al. | 438/464 |
| 2005/0263866 | A1* | 12/2005 | Wan | 257/678 |
| 2005/0264869 | A1* | 12/2005 | Chen et al. | 359/296 |
| 2006/0223244 | A1* | 10/2006 | Nihei | 438/166 |
| 2006/0226356 | A1* | 10/2006 | Huang et al. | 250/307 |
| 2007/0045861 | A1* | 3/2007 | Ohto et al. | 257/774 |
| 2007/0111340 | A1* | 5/2007 | Goldberger | 438/17 |
| 2007/0128827 | A1* | 6/2007 | Faris | 438/455 |
| 2007/0141330 | A1* | 6/2007 | Morishima et al. | 428/343 |
| 2007/0269928 | A1* | 11/2007 | Farooq et al. | 438/108 |

FOREIGN PATENT DOCUMENTS

| | | |
|---|---|---|
| EP | 0 926 732 A2 | 6/1999 |

* cited by examiner

METHOD OF REDUCING CONTAMINATION BY PROVIDING A REMOVABLE POLYMER PROTECTION FILM DURING MICROSTRUCTURE PROCESSING

BACKGROUND OF THE INVENTION

1. Field of the Invention

Generally, the present disclosure relates to the field of fabricating microstructure devices, and, more particularly, to techniques for enhancing product yield by reducing the defect rate at several process stages during the formation of complex microstructures, such as integrated circuits and the like.

2. Description of the Related Art

Today's global market forces manufacturers of mass products to offer high quality products at a low price. It is thus important to improve yield and process efficiency to minimize production costs. This holds especially true in the field of fabricating microstructures having a complex configuration, such as advanced integrated circuits, since here it is essential to combine cutting edge technology with mass production techniques. It is, therefore, the goal of manufacturers of microstructures to reduce the consumption of raw materials and consumables while at the same time improve process tool utilization. The latter aspect is especially important, since in modern semiconductor facilities, equipment is required which is extremely cost intensive and represents the dominant part of the total production costs. Consequently, high tool utilization in combination with a high product yield, i.e., with a high ratio of good devices and faulty devices, results in increased profitability.

Complex microstructures, such as integrated circuits, are typically manufactured in automated or semi-automated facilities, thereby passing through a large number of process and metrology steps to complete the device. The number and the type of process steps and metrology steps a semiconductor device has to go through depends on the specifics of the device to be fabricated. For example, a usual process flow for an integrated circuit, which may be considered as a representative of a complex microstructure, may include a plurality of photolithography steps to image a circuit pattern for a specific device layer into a resist layer, which is subsequently patterned to form a resist mask used in further processes for forming device features in the device layer under consideration by, for example, etch, implant, deposition, polish processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration. Since many of these processes are very critical, a plurality of metrology steps have to be performed to efficiently control the process flow. Typical metrology processes may include the measurement of layer thickness, the determination of dimensions of critical features, such as the gate length of transistors, the measurement of dopant profiles, the number, the size and the type of defects, and finally the electrical characteristics, which may represent the contribution of a plurality of process stages and which may finally decide whether a device is an operational device or a faulty device.

In a semiconductor facility, a plurality of different product types are usually manufactured at the same time, such as memory chips of different design and storage capacity, CPUs of different design and operating speed, and the like, wherein the number of different product types may even reach one hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools, metrology tools and the like, may be necessary. Consequently, the process flow in the facility may be very complex, since many re-entrant processes, i.e., a repeated use of the same process tools at different manufacturing stages of a specific type of product, and many predictable and non-predictable events may occur during the manufacturing processes and the various metrology processes, resulting in respective waiting times of substrates at specific manufacturing stages. In some cases, extended idle time periods may have a significant influence on the status of the intermediate products, thereby contributing to a reduced product reliability and/or a reduced yield. For instance, in sophisticated semiconductor devices, frequently highly conductive metals, such as copper and the like, may be used in the wiring levels of the device, which are subject to increased corrosion even when stored in a controlled ambient. As previously noted, electrical tests are typically performed at specific manufacturing stages, in particular prior to dicing the substrates into individual chips, wherein more or less extended metal-containing surfaces may be exposed. Since electrical tests for each individual chip are usually time consuming and possibly only a limited test capacity may be available, a relatively long exposure of the metal surfaces of respective test and device pads may occur, thereby resulting in a significant modification of the exposed surfaces, such as corrosion, discoloration and the like. Moreover, the electrical test process itself may create significant particle contamination due to the operation of the probe electrodes and the like in close proximity to the substrates. In other processes, such as CMP processes, a plurality of defects may also be created, such as particles, which may deposit on exposed wafer surfaces, tool surfaces and the like, thereby additionally contributing to an increased defect rate, which may finally reduce the overall production yield.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for reducing the exposure of sensitive surface areas during the processing of microstructures, such as integrated circuits, in a corresponding facility. For this purpose, at certain manufacturing stages of the microstructure devices, an appropriate protective film or layer may be formed in order to efficiently protect exposed surface areas during further transport activities and/or process and metrology steps. In some illustrative embodiments, the protective film or layer may have a foil-like consistency in order to facilitate the attachment and/or the removal of the protective film prior to and/or after a subsequent process or metrology step, in which surface portions or the entire surface of the substrate have to be accessed without the protective film or layer. In other illustrative embodiments, specific surface portions, for instance metal or contact regions, may be accessed or contacted through the protective film or layer, thereby significantly reducing the particle contamination of the remaining substrate surface. Consequently, particle contamination as well as degradation of sensitive exposed surface portions may be significantly reduced by temporarily providing the protective film or layer so as to significantly reduce the influence of varying waiting times prior to specific processes and/or during processes which may per se in standard conventional process techniques result in an undesired moderately long exposure of sensitive surface portions to the ambient atmosphere.

According to one illustrative embodiment disclosed herein, a method comprises forming a foil-like protective film above a substrate comprising a plurality of microstructure devices at a first intermediate manufacturing stage. Furthermore, the foil-like protective film is drawn off from the substrate at a second intermediate manufacturing stage.

According to another illustrative embodiment disclosed herein, a method comprises forming a protective layer above a substrate having formed thereon a plurality of microstructures including at least one contact surface portion. Furthermore, the at least one contact surface portion is contacted by a probe through the protective layer and the protective layer is removed after contacting the at least one contact surface portion.

According to yet another illustrative embodiment disclosed herein, a method comprises performing a first manufacturing process on a substrate comprising a plurality of microstructure devices. The method further comprises determining an evaluation value for an expected waiting time of the substrate for a second manufacturing process and/or for a defect rate. Finally, a protective layer is formed above the substrate when the determined evaluation value exceeds a predetermined threshold.

BRIEF DESCRIPTION OF THE DRAWINGS

The disclosure may be understood by reference to the following description taken in conjunction with the accompanying drawings, in which like reference numerals identify like elements, and in which.

Figure 1A:
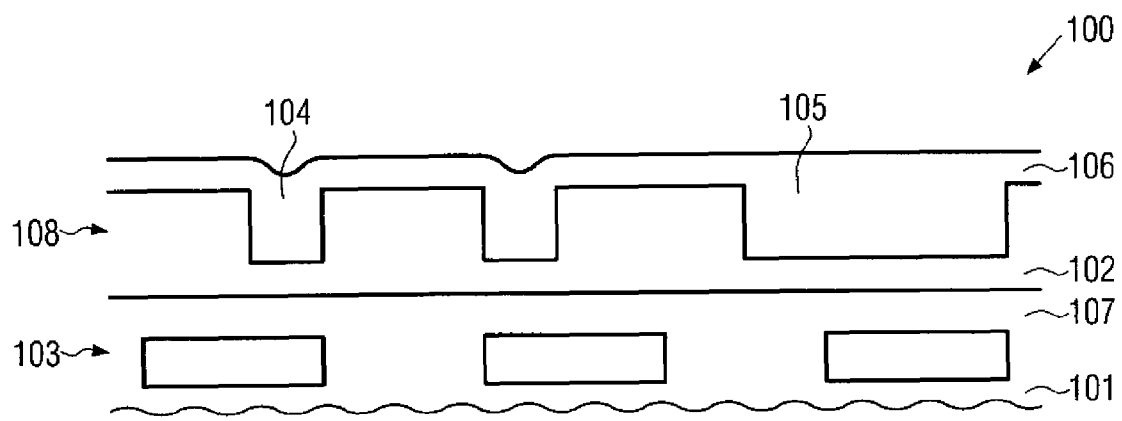
FIGS. 1a-1c schematically illustrate cross-sectional views of a microstructure device during various manufacturing stages, wherein a protective film is temporarily formed on exposed surface portions which may be drawn off prior to a specific manufacturing process so as to significantly reduce particle contamination of the microstructure device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the problem of degradation of exposed surface areas during the fabrication of complex microstructures, such as sophisticated integrated circuits and the like, in which a complex sequence of manufacturing processes and metrology steps are performed, wherein, during a plurality of process or metrology steps, an increased probability for surface contamination or degradation may exist. For example, in the fabrication of highly complex semiconductor devices, a plurality of process steps may have to be performed which per se may result in an increased defect density, wherein, in addition to surface defects such as cracks, a significant amount of substantially loose particles or material flakes may also be created. One prominent manufacturing process in this respect may be a chemical mechanical polishing (CMP) process, which may have to be frequently used for removing excess material and/or planarizing the resulting surface topography prior to a subsequent critical manufacturing process. For instance, in highly sophisticated microstructural devices, such as integrated circuits, one or more separate wiring levels, i.e., metallization layers, may have to be provided in order to establish the electrical connections between respective circuit elements, such as transistors, capacitors and the like, formed in one or more device levels according to a highly complex circuit layout. Due to the continuous reduction of critical feature sizes in order to increase device density and performance of integrated circuits, the respective sizes of conductive lines and vias also have to be reduced, thereby demanding highly conductive materials, such as copper, copper alloys, silver and the like, in combination with dielectric materials having a reduced permittivity. Since copper and alloys thereof may not be efficiently patterned by anisotropic plasma etch techniques, typically the so-called damascene or inlaid technique is used for forming metal lines and vias, wherein a dielectric material is patterned to receive respective trenches and via openings, which may be subsequently filled with an appropriate metal, thereby usually requiring a subsequent removal and planarization of the metal material. For this purpose, CMP techniques are frequently used, wherein per se a high degree of surface defects may be created, wherein, additionally, the reduced mechanical stability of low-k dielectrics may further result in the creation of a plurality of particle defects, which may significantly contribute to device and tool contamination. In addition to significantly interfering further processing steps, respective particle contaminations may also result in an unwanted material diffusion, as for instance copper may readily diffuse in silicon dioxide and a plurality of further dielectric materials, such as low-k dielectrics, so that even minute amounts of copper may reach sensitive device areas, thereby significantly altering the electrical behavior of circuit elements, such as transistors and the like. Furthermore, exposed copper surfaces tend to readily react with minute amounts of oxygen, fluorine, moisture and the like so as to create a respective corrosion or discoloration, which may therefore negatively affect the material characteristics of the respective metal region and may also influence further results of subsequent process steps.

As previously explained, highly complex microstructures, such as advanced integrated circuits, require a large number of process and metrology steps, which are typically performed in an automated or semi-automated facility, thereby requiring a complex transport system for appropriately supplying the substrates to the respective process and metrology tools. Consequently, a plurality of substrate handling processes have to be performed in order to process the substrate in the respective process and metrology tools, insert the substrates in the respective transport carriers and finally remove the substrates from the carriers in a further process or metrology tool. Typically, a large number of different products are simultaneously processed in a microstructure facility, thereby requiring a complex scheduling scheme in order to obtain high throughput of the individual complex process and metrology tools. However, significant delays in the processing of substrates may be encountered, wherein an undue exposure of surface portions over extended time periods may result in an increased surface degradation, for instance of exposed copper-containing surfaces, thereby creating a varying degree of corrosion depending on the effective waiting time for the several substrates. In other cases, certain process steps may require per se an extended exposure of highly sensitive surface portions, such as large copper-containing metal surfaces, thereby also resulting in an increased degree of corrosion. For example, during the fabrication of complex integrated circuits, one or more metrology steps may have to be performed, in which electrical data may be obtained from one or more substrates. To this end, respective contact areas may have to be accessed by respective electrical probes in order to obtain the desired measurement data. One important metrology step in this respect is the wafer electrical test (WET), in which each microstructure device is tested to estimate the operational behavior of the respective individual devices. For this purpose, respective contact areas have to be accessed by the test probes, wherein, in addition to a moderately long time period required by the measurement process itself for an entire substrate, a moderately long waiting time prior to the test procedure may also contribute to an increased defect rate caused by additional particle contamination during the measurement process, thereby contributing to a significant degradation of the exposed surface portions. Consequently, a significant reduction of yield may be observed at a very late manufacturing stage.

The subject matter disclosed herein therefore provides a reduced degree of exposure of sensitive surface portions during various stages of the manufacturing sequence of complex microstructure devices by at least temporarily providing an appropriate protective layer, which may be provided at any appropriate stage of the manufacturing process and which may be readily removed on the basis of a suitable removal process when the protective layer may not be compatible with a subsequent manufacturing process. For instance, in some illustrative embodiments, the protective layer may be provided in the form of a foil-like material film, for instance made of appropriate polymer materials, so that the corresponding protective film may be formed by any appropriate deposition technique, such as spin-on techniques, chemical vapor deposition (CVD) techniques, or may even be attached mechanically to the substrate surface as a foil in order to protect the surface and/or the back side, if desired, of the respective substrates, for instance during transport and/or other substrate handling processes. Moreover, the provision of the respective protective layer may significantly reduce the degree of exposure to the ambient atmosphere so that an increased independence from respective waiting times at specific process or metrology tools may be obtained. Since the formation of the protective layer and the removal thereof may, at least in some illustrative embodiments, be accomplished on the basis of highly efficient deposition techniques, while the removal of the respective protective layer may include a simple mechanical drawing off, a significant contribution to process complexity and/or defect rate may be avoided or reduced.

In other illustrative embodiments, the material characteristics of the protective film may be selected such that the protective film may be maintained during certain manufacturing or metrology processes, or the mechanical characteristics of the protective film may be temporarily modified to allow access of specific surface areas, while still reliably protecting the remaining portions of the substrate. Consequently, by providing a respective protective layer at appropriate manufacturing stages, any surface degradation mechanisms encountered during transport, processing and measuring of substrates may be significantly reduced. It should be appreciated that the subject matter disclosed herein is highly advantageous in the context of complex integrated circuits, since here highly sensitive materials, such as copper, copper alloys, silver and the like, may be processed and may be exposed to the clean room ambient, while a reduced mechanical stability of low-k dielectric materials may further enhance particle contamination during the process flow. However, the principles disclosed herein may also be readily applied to the manufacture of any microstructure devices, wherein the intermediate provision of the protective layer provides significantly relaxed constraints with respect to scheduling the transport and product stream flow within a respective facility. For instance, in some illustrative embodiments, specific process tools may be supplemented by a respective film deposition module and film removal module such that upon arrival the respective protective film may be efficiently removed and may again be formed prior to leaving a respective process tool, thereby significantly relaxing any constraints with respect to particle and tool contamination, as well as idle times of the entire process flow.

In FIG. 1a, a microstructure 100 comprises a substrate 101 which may represent any appropriate carrier material for forming thereon and therein respective microstructure devices, such as integrated circuits, micromechanical devices, optoelectronic devices or any combination thereof. Thus, the substrate 101 may represent a semiconductor substrate having formed therein a plurality of integrated circuits, each of which may represent a microstructure device 103, which may be separated in a later manufacturing stage so as to receive an individual package or be attached to any other appropriate carrier material. In some illustrative embodiments, the substrate 101 may represent an appropriate carrier material for forming thereon and therein silicon-based complex integrated circuits, wherein the individual microstructure devices 103 may comprise a plurality of transistor elements, capacitors and the like. The individual devices 103 may be embedded in an appropriate material, such as a dielectric material, wherein respective conductive contacts may be provided (not shown) to electrically connect the devices 103 with an overlying metallization structure 108, which in the example shown may comprise at least one dielectric layer 102 having formed therein respective metal-containing regions 104 and one or more contact surface portions 105, which may have a size appropriate for being contacted by an electrical probe. As previously explained, the metallization structure 108 may comprise, in sophisticated applications, a low-k dielectric material, i.e., a dielectric material having a relative permittivity of 3.0 and significantly less, wherein the metal-containing regions 104 and 105 may comprise highly conductive metals, such as copper, copper alloy, silver, gold, platinum and the like. In one illustrative embodiment, the metallization structure 108 may comprise a low-k dielectric material in combination with a copper-containing material in the respective metal-containing regions 104, 105. In the manufacturing stage shown in FIG. 1a, the metal material may be provided in the form of a metal-containing layer 106, such as a copper layer, which may be provided with a certain amount of excess material in order to reliably fill the respective metal-containing regions 104, 105.

A typical process flow for forming the microstructure 100 as shown in FIG. 1a may comprise the following processes. After the formation of the microstructure devices 103 on the basis of well-established manufacturing techniques, the dielectric material 107 may be formed, for instance, by appropriate deposition techniques, including high density plasma chemical vapor deposition, sub-atmospheric chemical vapor deposition and the like. Thereafter, respective contacts may be formed on the basis of lithography and appropriate etch techniques, as are well-established in the art. Next, the metallization structure 108 may be formed by providing an appropriate dielectric material, which may comprise appropriate etch stop, capping and other layers, possibly in combination with a low-k dielectric material, wherein the dielectric layer 102 may then be patterned so as to receive appropriate openings substantially representing the regions 104, 105. Thereafter, the layer 106 may be formed by any appropriate deposition technique, such as CVD, ALD, electroless plating, electroplating or any combination thereof. It should be appreciated that the formation of the metallization structure 108 may also include other process strategies, including mechanical lithography techniques, such as imprint techniques in combination with any appropriate patterning strategies for forming appropriate openings in a respective material, wherein, depending on the process flow, the final configuration of the dielectric material 102 may be established prior to, as previously explained, or after the formation of the respective metal-containing regions 104, 105. In one illustrative embodiment, after the deposition of the metal layer 106, the surface topography of the structure 100 may be planarized, thereby also removing any excess material of the layer 106 so as to electrically insulate the respective regions 104, 105. For example, a CMP process may be performed which, as previously explained, may result in the creation of a significant amount of surface defects including a plurality of particle defects. With the continuous reduction of features sizes, thereby enhancing the packing density, in combination with an ever increasing size of the substrate 101, respective particles may cause a significant reduction of production yield.

Figure 1B:
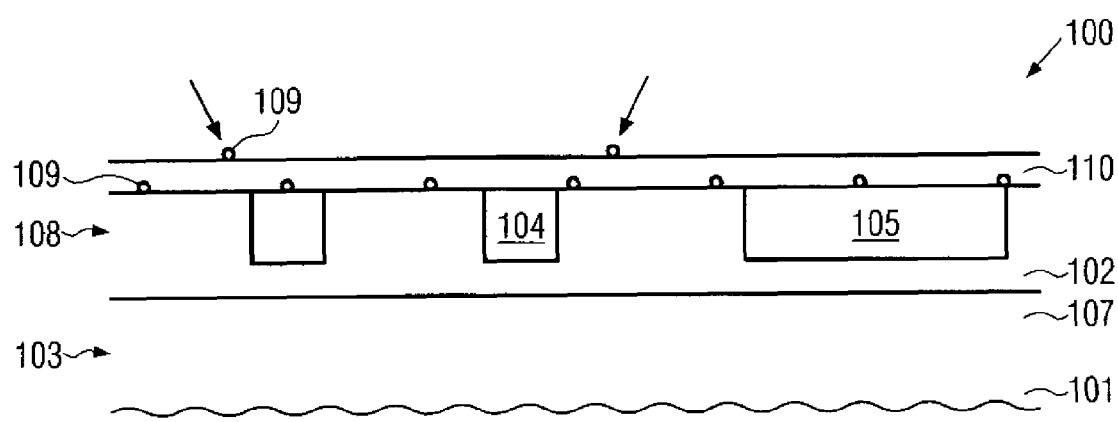

FIG. 1b schematically illustrates a cross-sectional view of the device 100 in a further advanced manufacturing stage. A protective layer 110 is formed at least over the front surface of the substrate 101 wherein, in some illustrative embodiments, the protective layer 110 may be formed of an appropriate material so as to provide substantially foil-like characteristics at least in a later manufacturing stage, when the protective layer 110 is to be removed. Thus, the term "foil-like" is to be understood that the protective layer 110 may have a consistency that enables removing significant portions having a size of several $cm^2$ or the entire layer by mechanically drawing off the portions or the entire layer. For example, a plurality of polymer materials may be used for forming the protective layer 110, which after the deposition and possibly after any appropriate treatment, such as curing, heating and the like, may have a high degree of resistance against being torn apart, even if a thickness of the protective layer 110 is in the range of 1 micrometer to several micrometers. In other cases, depending on the material characteristics, the protective layer 110 may have a thickness of approximately 100 nm up to several hundred nm. In one illustrative embodiment, the protective layer 110 may be provided in the form of an appropriate foil material, which may be attachable to the surface of the structure 100 by a mechanical process. Moreover, as previously explained, a plurality of particle defects 109 may have been formed during the preceding manufacturing processes and may adhere to the surface of the structure 100.

The protective layer 110 may be formed, depending on the process strategy, on the basis of any appropriate technique, including, for instance, a spin-coating process for polymer materials that may be applied in a low viscous state. In other cases, respective deposition techniques, such as CVD and the like, may be used to form the layer 110 with a desired thickness and material composition. Furthermore, as previously explained, the layer 110 may in some embodiments be applied as a foil material by mechanically attaching the foil to the surface of the structure 100. In still other illustrative embodiments, the protective layer 110 may also be formed at a portion of the back side of the substrate 101 or even above the entire back side. In this case, depending on the manufacturing stage of the device 100, a back side contamination of the substrate 101 may be significantly reduced. Moreover, since many of the substrate handling processes are performed by contacting the back side and/or the substrate edge region (not shown), a reliable coverage of the respective areas may also significantly reduce the creation of respective defects, which may otherwise result in an increased substrate and tool contamination. During the formation of the protective layer 110, depending on the process technique used, a more or less pronounced "embedding" effect of the previously created particles 109 may be achieved. For instance, during a spin-on deposition or a CVD deposition, the corresponding material of the layer 110 may efficiently enclose the respective particles 109 and these particles may have, possibly after any treatment of the layer 110, an increased adhesion to the material of the layer 110 compared to respective surface portions of the structure 100. Consequently, at least some of the particles 109 may be "incorporated" into the protective layer 110 and may therefore be removed with the removal of the protective layer in a later manufacturing stage, thereby reducing the number of defects of the structure 100.

After the formation of the layer 110, which may include any surface treatments, such as curing, heating, exposure to radiation and the like, the structure 100, which has received the protective layer 110 at a first manufacturing stage, may undergo several process activities such as transportation and the like, which may include respective substrate handling processes, waiting times at respective process tools and the like. As previously explained, during respective activities such as transportation and the like, an exposure of sensitive surface portions, such as the metal-containing regions 104, 105 may be significantly reduced, thereby also reducing the degree of metal corrosion, in particular when moderately extended waiting times between transport activities and a subsequent process step may occur. Moreover, as illustrated, during the respective substrate handling processes and transport activities as well as process steps, in which the protective layer 110 may not interfere with the respective process, such as processes performed on the back side when not being covered by the protective layer 110 and the like, respective particles 109 may deposit on the protective layer 110, which in conventional techniques would also contribute to the overall defect rate of the structure 100.

Figure 1C:
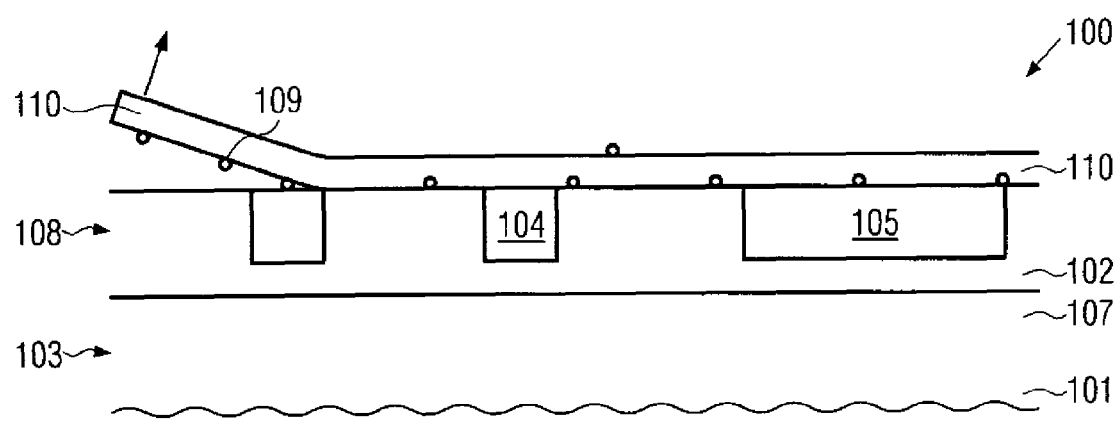

FIG. 1c schematically illustrates the microstructure 100 in a further advanced or second manufacturing stage, i.e., the manufacturing stage at which access to the surface of the structure 100 may be required. Consequently, the protective layer 110, having in this illustrative embodiment a foil-like material characteristic, may be removed by mechanically drawing off the layer 110, thereby also removing at least some and perhaps all of the particles 109 deposited thereon during the preceding substrate handling activities, while a significant amount of particles 109, previously embedded or incorporated into the layer 110, may also be removed along with the protective layer 110, thereby reducing the corresponding defect rate previously generated in the manufacturing process as described with reference to FIG. 1a. The drawing off of the layer 110, as illustrated in FIG. 1c, may be accomplished by contacting specific surface portions, for instance the edge region of the substrate 101, for instance on the basis of a vacuum gripper and the like, and locally or globally drawing off the layer 110. In other illustrative embodiments, respective "handles" (not shown) may be provided during the formation of the protective layer 110 at specified locations so as to allow a mechanical contact of the respective handle by any appropriate mechanical gripper and the like. For instance, during the formation of the protective layer 110, an area of increased layer thickness may be provided at a specific substrate position in order to enable a reliable mechanical contact with an appropriate mechanical instrument. In other cases, after the formation of the protective layer 110, when still being in a deformable state, an appropriate surface pattern (not shown) may be formed on the exposed surface of the layer 110 or at least at dedicated surface portions to enable an efficient removal of the layer 110 at a later manufacturing stage. For example, appropriate patterns may be created that facilitate the contact with a respective vacuum gripper to establish a reliable mechanical contact for drawing off of the protective layer 110. In some illustrative embodiments, a similar technique may be used for attaching the protective layer 110 to the structure 100. That is, appropriately dimensioned pieces of material for the protective layer 110 may be prepared in advance and may be mechanically attached to the structure 100, wherein the respective process for attaching and removing the protective layer 110 may be accomplished in a fast and reliable fashion, thereby significantly reducing the overall process time required for forming and removing the protective layer 110. Consequently, respective modules may readily be incorporated into the overall manufacturing flow to provide a protective layer 110 at any appropriate manufacturing stage in order to significantly reduce surface corrosion and/or defect rate. For example, in highly complex semiconductor facilities, there is an ongoing tendency for using complex cluster tools in which a plurality of interrelated process steps may be performed within a single mainframe to reduce transport activities and increase overall process efficiency. Thus, after a respective complete cycle in a respective cluster tool, the protective layer 110 may be efficiently formed on the corresponding substrates, which may then be transported to other process steps with reduced defect rate and surface corrosion, wherein the total contribution of forming and removing the protective layer 110 with respect to the process steps performed in the respective cluster tool is moderately low, thereby substantially not negatively affecting the total throughput, while significantly enhancing production yield.

Figure 1D:
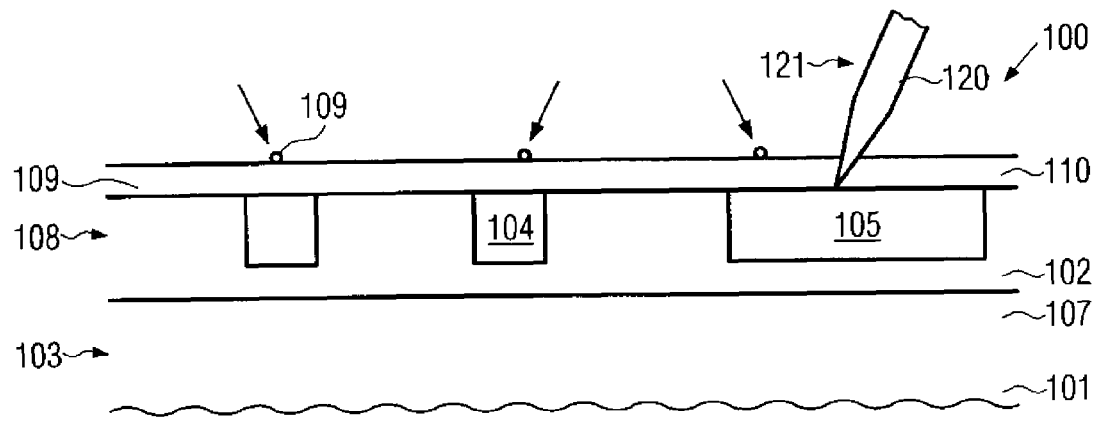
FIG. 1d schematically illustrates a cross-sectional view of a microstructure device during an electrical wafer test, in which a specific surface portion is contacted through a protective layer in accordance with illustrative embodiments disclosed herein.

FIG. 1d schematically illustrates the structure 100 according to further illustrative embodiments in which the protective layer 110 has been formed at a first manufacturing stage, that is, any appropriate manufacturing stage prior to performing an electrical test procedure, in which at least some of the metal-containing regions 104, 105, such as the region 105, may have to be contacted by a respective electrical probe 120, in order to obtain respective measurement results. Thus, the structure 100 may be subjected to a measurement process 121, wherein the probe 120 contacts the region 105 through the protective layer 110, which thus may have appropriate material characteristics to enable penetration by the electrical probe 120. For instance, a plurality of polymer materials may have a respective deformable state, which provides sufficient mechanical stability while nevertheless enabling it to be punctuated by the electrical probe 120. In one illustrative embodiment, the measurement process 121 may represent a wafer electrical test in which the operational behavior of the individual microstructure devices 103 may be tested, thereby requiring a plurality of the regions 105 across the entire substrate 101 to be contacted by respective electrical probes 120. Since the capacity of respective electrical test equipment is restricted, the corresponding process 121 may last for an extended time period, wherein typically extended waiting times prior to the process 121 may occur. Thus, in conventional cases, an undue exposure to the clean room ambient may occur, thereby contributing to an increased degree of surface corrosion. Moreover, due to a plurality of mechanical activities, for instance for contacting the respective regions 105, an increased deposition of particles may usually be observed during the measurement process 121. In the present embodiment, the respective particles 109 may deposit on the protective layer 110, thereby substantially avoiding the creation of particle defects of the structure 100. Furthermore, due to the provision of the layer 110, the defects of the exposure to the ambient atmosphere may be significantly reduced, even for the respective regions 105 that are to be contacted by the probes 120. Consequently, increased process uniformity may be established during the measurement process 121, irrespective of the capability of the test equipment, the corresponding waiting time, the substrate dimension and the like.

After the measurement process 121, the protective layer 110 may be removed on the basis of any appropriate process, wherein the removal process may be performed immediately prior to a respective further manufacturing process, such as the formation of respective passivation layers, solder bumps and the like. It should be appreciated that the measurement process 121, which may require a direct contact of at least some surface portions of the structure 100, may be performed at any appropriate manufacturing stage and may not be restricted to the last metallization layer of a complex metallization structure. For instance, respective electrical test measurements may be performed in a plurality of respective metallization layers, wherein, due to the provision of respective protective layers 110, the probability of creating defects and causing undue corrosion may be significantly reduced. Moreover, the protective layer 110 may also be formed after any critical process steps, as previously explained with reference to FIG. 1a, so as to more efficiently remove particles from surface portions, which may otherwise require the use of complex rinsing and cleaning processes, while additionally significant advantages may be gained with respect to substrate transport and handling activities, as is previously explained.

Figure 1E:
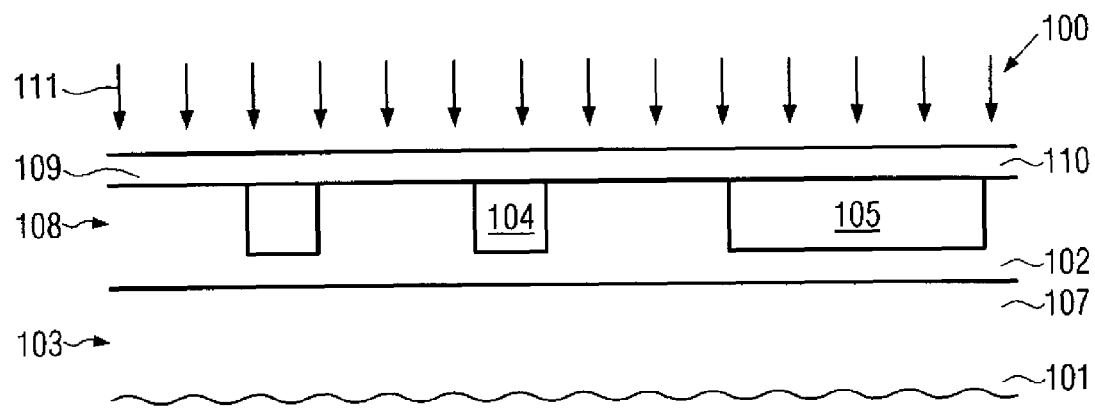
FIGS. 1e-1f schematically illustrate cross-sectional views of a microstructure device in which a protective layer is formed and is at least locally modified so as to allow access by test probes at specific surface areas according to further illustrative embodiments disclosed herein.

FIG. 1e schematically illustrates the structure 100 during the formation of the protective layer 110 in accordance with other illustrative embodiments. In this case, the protective layer 110 may be formed by any appropriate deposition process 111, such as spin-on, CVD, mechanical attachment and the like. The layer 110 may be formed of any appropriate material, such as polymer material, wherein the material characteristics of the layer 110 may be modified, at least locally, in a later stage, depending on the process requirements. For example, the layer 110 may have any material characteristics, which may not necessarily represent a foil-like behavior as long as the material characteristics may allow it to be modified so as to obtain, at least locally, the desired behavior.

Figure 1F:
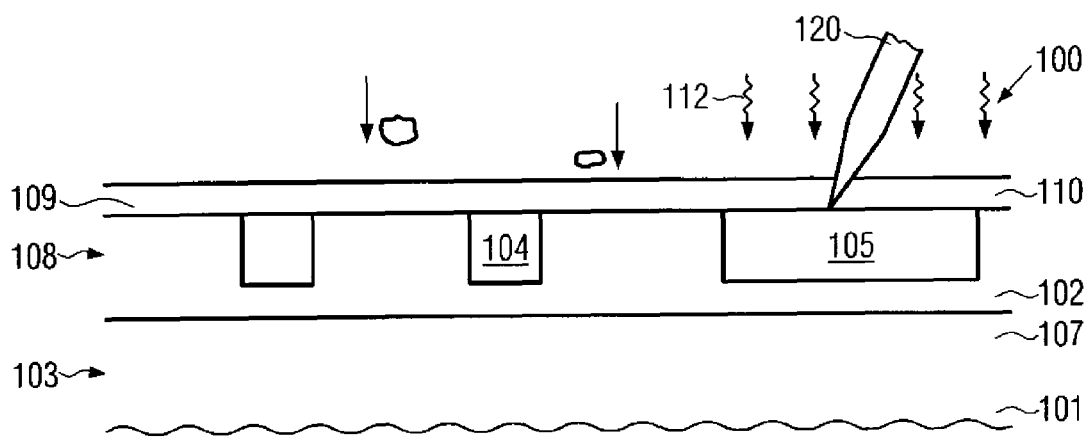

FIG. 1f schematically illustrates the structure 100 in a further advanced manufacturing stage in which the region 105 may be contacted by the electrical probe 120, wherein a surface treatment 112 may be performed so as to at least locally modify the material characteristics of the protective layer 110 in order to facilitate the contacting of the region 105 by the probe 120. In one illustrative embodiment, the protective layer 110 may be brought, at least locally, into a highly deformable state immediately prior to contacting the region 105 by the probe 120, thereby increasing the reliability of the electrical contact between the probe 120 and the region 105 substantially without reducing the degree of surface protection provided by the layer 110. For example, the treatment 112 may comprise a heat treatment, which may be locally restricted to an area in the vicinity of the region 105, or which may involve substantially the entire substrate 101, in order to provide a highly deformable state of the layer 110 so as to facilitate the penetration and the removal of the electrical probe 120. For instance, if the treatment 112 is to be provided in a highly localized manner, the electrical probe 120 may be heated so as to locally bring the protective layer 110 into a highly deformable state. In other cases, a local treatment may be accomplished by directing a beam, such as a laser beam, onto a desired surface portion of the substrate 101 prior to and/or during contacting the region 105 by the probe 120. Consequently, prior to a respective measurement process, the protective layer 110 may reliably reduce surface corrosion and particle deposition, wherein the layer 110 may have any appropriate state providing sufficiently high mechanical stability, while during the respective measurement process, at least locally, the material characteristics may be changed in order to facilitate the contact of the region 105, while the surface is still sufficiently protected against particle deposition during the measurement process. Thereafter, the protective layer 110 may be removed, when the characteristics thereof are not compatible with the subsequent processing or the device requirements, at any appropriate point in time on the basis of any appropriate removal process, such as an etch process, a mechanical removal and the like. In other embodiments, the protective layer may be maintained as a part of a passivation layer, when the corresponding material properties are appropriate. Consequently, a high degree of flexibility in using appropriate materials for the protective layer 110 may be achieved, since the treatment 112 may provide the desired mechanical characteristics of the protective layer 110 when a mechanical contact of surface portions of the substrate is required. Thereafter, the desired mechanical characteristics of the protective layer 110 may be re-established, for instance by stopping the treatment 112 or by performing a further treatment, such as curing, irradiating, chemical modification and the like.

Figure 2:
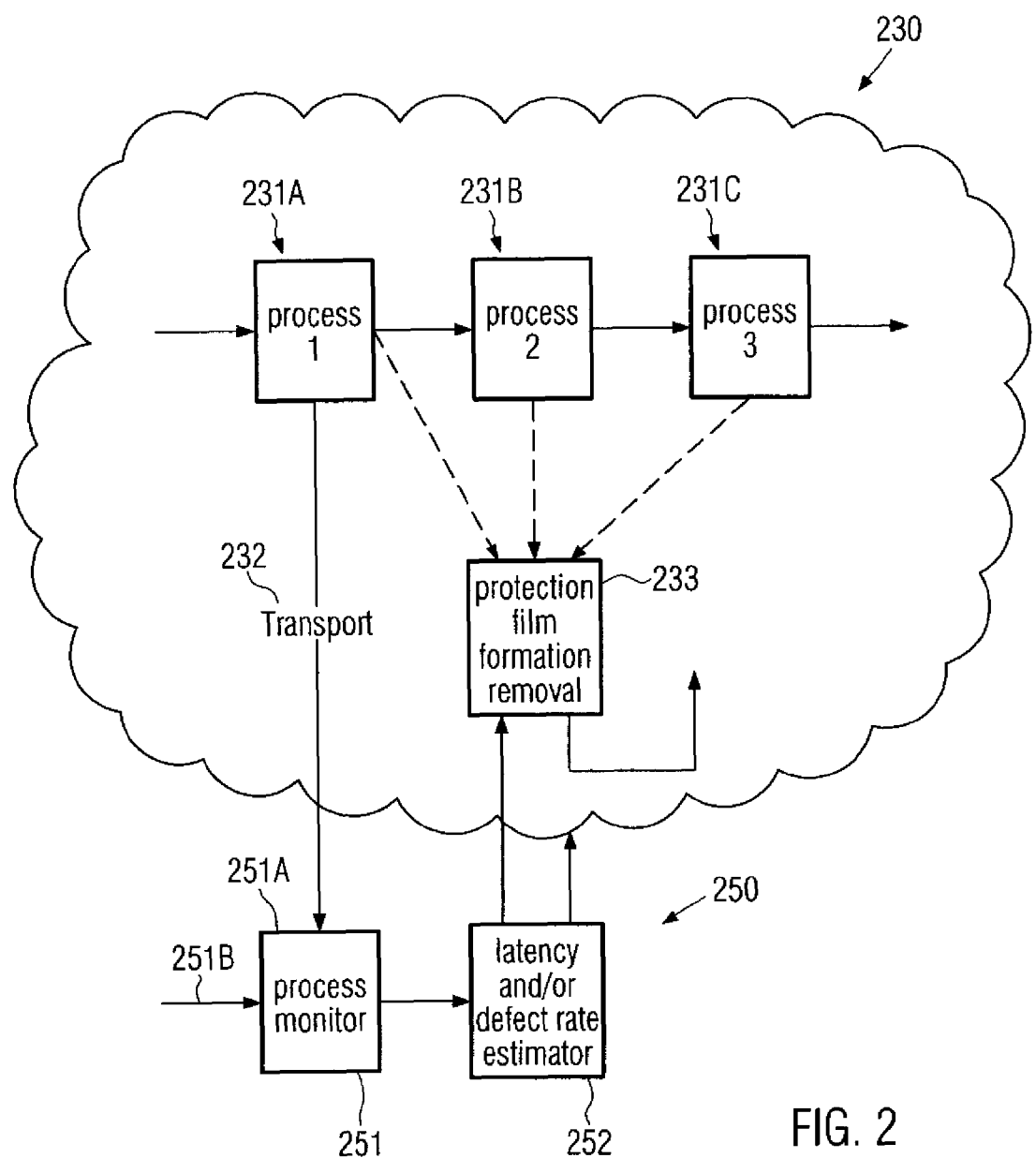
FIG. 2 schematically illustrates a process strategy in which a protective layer or film may be formed on the basis of process-specific information, such as expected waiting time, defect rate caused by transportation and/or previous or subsequent processes and/or metrology steps, and the like, according to yet other illustrative embodiments disclosed herein.

FIG. 2 schematically illustrates a system 250 for evaluating the process flow within a manufacturing environment 230 with respect to the provision of a protective film 110 in order to enhance production yield substantially without degrading process efficiency in the environment 230. The manufacturing environment 230 may comprise a plurality of process tools 231A, 231B, 231C which may define a respective process flow for substrates, such as the substrate 101, in order to create a plurality of microstructure devices, such as the devices 103, on a common substrate. For instance, the environment 230 may represent a manufacturing environment for forming complex semiconductor devices requiring processes, such as implantation, deposition, lithography, etching, annealing and the like. The environment 230 may further comprise a transport system 232, which may perform the respective substrate transport activities for delivering the respective substrates to the corresponding process tools 231A, 231B, 231C in accordance with a specific schedule, which may be established in advance or which may be appropriately updated by a corresponding supervising control system, such as an MES (manufacturing execution system) (not shown) as typically provided in sophisticated manufacturing environments. The manufacturing environment 230 may further comprise one or more process modules 233 for forming and/or removing an appropriate protective layer 110 at a specified manufacturing stage, such as the protective layer 110 as previously described with reference to FIGS. 1e-1f. The one or more process modules 233 are also connected to the transport system 232 so as to allow transport of substrates to and from the modules 233 and to and from at least some of the plurality of process tools 231A, 231B, 231C. It should be appreciated that one or more of the at least one or more process modules 233 may also be provided in close proximity to one or more of the process tools 231A, 231B, 231C as is previously explained.

The system 250 may comprise a process monitor 251, which may receive respective process information 251A from the manufacturing environment 230, for instance from one or more of the process tools 231A, 231B, 231C and/or may receive process information 251B from a supervising control system or any other source. For example, the process monitor 251 may receive respective information on the scheduling of respective substrates to be processed in the environment 230. Moreover, the monitor may also receive respective information on the actual state of the environment 230, for instance with respect to predictable or currently occurring idle times or down times of process tools in the environment 230, the state of the transport system 232, and the like. The process monitor 251 may be operatively coupled to an estimator 252 for providing an estimation for necessity for a protective layer 110, which in one illustrative embodiment may estimate an expected latency or waiting time of respective substrates, when being processed in the environment 230, based on the information provided by the process monitor 251. In other cases, an expected defect rate may be estimated by the module 252 for one or more substrates at a first manufacturing stage with respect to a later manufacturing stage. For instance, based on the information delivered by the process monitor 251, the estimator 252 may predict a waiting time for specific substrates, such as substrates requiring an electrical test, including a respective process time for the actual test, wherein, depending on the estimated value, the estimator 252 may decide whether or not the provision of an appropriate protective film at this manufacturing stage may be appropriate or not. For instance, in one illustrative embodiment, a predefined threshold for a total time of exposure to the ambient atmosphere, starting from a defined process stage, may be compared with the estimated value for the substrate to be processed in the environment 230 and a corresponding protective film may be formed in the modules 233, when the respective threshold value is exceeded by one or more of the substrates under consideration. For this purpose, the estimator 252 may advise the transport system 232 and the one or more modules 233 to initiate the respective process activities for forming an appropriate protective layer. Similarly, the estimator 252 may provide an expected defect rate after one or more process steps, including transport activities and the like, wherein a comparison with a predefined threshold may indicate whether or not a respective protective layer at this manufacturing stage may be formed in one or more of the modules 233. In some illustrative embodiments, the process monitor 251 may receive respective estimated values from the estimator 252 to determine an appropriately rescheduled process sequence for the environment 230 in order to maintain an overall reduction of throughput, caused by the additional formation and removal of protective layers, at a low level.

For example, the process tool 231A may represent a process for completing a metallization layer, which may, for instance, include a respective metal deposition and CMP process, wherein the respective metallization structure may have to be subjected to an electrical test in the process tool 231B. Consequently, the process monitor 251 may provide the relevant data to the estimator 252, which may then calculate respective expected values with respect to overall process time between the processes on the basis of the current process status. If, for instance, the corresponding measurement tool 231B may have a reduced capability and may require extended waiting times, the estimator 252 may instruct the transport system 232 to deliver the substrates under consideration to one or more of the modules 233 in order to form a respective protective layer 110 so as to reduce the negative impacts of the prolonged exposure to the ambient atmosphere. In other cases, when a high availability of the tool 231B may be encountered during a certain manufacturing stage for specified substrates and the corresponding defect rate is estimated less critical by the estimator 252, the corresponding substrates may be directly delivered to the tool 231B without forming a respective protective layer 110. Similarly, prior to delivering any substrates having formed thereon a respective protective layer to the subsequent process performed in the tool 231C, the estimator 252 may instruct the transport system 232 to provide the substrate under consideration to one or more of the modules 233 in order to remove a respective protective layer 110 prior to the treatment in the process tool 231C.

It should be appreciated that, based on the system 250, a high degree of surface protection may be achieved, substantially without unduly affecting the overall throughput of the manufacturing environment 230, since the requirement of an additional protective layer may be estimated on the basis of the current status of the environment 230 and/or on the specifics of the respective devices under consideration, thereby providing a high degree of process flexibility. For instance, in some manufacturing stages within the environment 230, a respective protective film 110 may be formed with a high degree of coverage of the product stream, since here a significant reduction of defect rate, metal erosion and the like may be achieved, as is for instance described with reference to electrical test measurements, while, in other manufacturing stages, a respective protective layer may be formed "on demand" since less critical manufacturing conditions may not require a corresponding enhanced protection for each type of product or for each manufacturing stage.

As a result, the subject matter disclosed herein provides an increased degree of protection of surface areas during the manufacturing of microstructure devices in that an appropriate protective layer 110 may be formed at a specified manufacturing stage and may be removed at a further advanced appropriate manufacturing stage. The protective film 110 may reduce the degree of particle contamination created in a previous process step by efficiently incorporating the particles which may then, at least partially, be removed together with the protective layer 110 in a later manufacturing stage, wherein, also, in any intermediate processes, such as transport activities, substrate handling activities and the like, a further particle contamination is substantially avoided. In some illustrative embodiments, the respective protective layer 110 may be provided as a foil-like material, which may be efficiently removed at any appropriate manufacturing stage on the basis of respective mechanical techniques. Furthermore, in some illustrative embodiments, the material characteristics of the protective layer 110 may, at least locally, allow a direct contact of an underlying surface portion by a respective probe, thereby reducing exposure of sensitive surface portions to the ambient atmosphere and also substantially avoiding any additional particle contamination during the respective manufacturing process. For example, the protective film or layer 110 may be formed after respective metal polish processes of the various metallization layers in highly complex integrated circuits. Consequently, production yield may be significantly enhanced without significantly contributing to the overall process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a deposition process to form a protective film comprising a protective material layer above a substrate comprising a plurality of microstructure devices at a first intermediate manufacturing stage, wherein said deposition process is performed after a manufacturing process that creates particle defects on said microstructure devices; and
mechanically drawing off said protective film from said substrate at a second intermediate manufacturing stage, wherein mechanically drawing off said protective film comprises performing a non-etching process.

2. The method of claim 1, wherein said plurality of microstructure devices comprise exposed metal surfaces at said first intermediate manufacturing stage.

3. The method of claim 1, further comprising performing an electrical test measurement between said first and second intermediate manufacturing stages.

4. The method of claim 1, wherein said manufacturing process that creates particle defects on said microstructure devices comprises a chemical mechanical polishing process.

5. The method of claim 1, wherein said protective film is drawn off as a single continuous layer.

6. The method of claim 1, wherein mechanically drawing off said protective film comprises lifting at least a portion of said protective film from a surface of said substrate by grasping said protective film with a vacuum gripper tool or by grasping at least one handle coupled to said protective film.

7. the method of claim 1, wherein said deposition process comprises one of a spin-on deposition technique and a chemical vapor deposition technique.

8. The method of claim 1, wherein said protective film is adapted to protect at least one of said plurality of microstructure devices during at least one additional intermediate manufacturing process performed on said substrate between said first intermediate manufacturing stage and said second intermediate manufacturing stage.

9. The method of claim 1, wherein forming said protective film comprises forming said protective material layer such that it adheres to at least some of said particle defects on said plurality of microstructure devices.

10. The method of claim 1, further comprising exposing said protective film to at least one of a curing, heating, and radiation treatment prior to said second intermediate manufacturing stage.

11. The method of claim 3, wherein performing an electrical test measurement comprises contacting at least one surface portion of said substrate with a probe through said protective film.

12. The method of claim 11, wherein at least one material characteristic of said protective film is changed when contacting said at least one surface portion.

13. The method of claim 12, wherein said at least one material characteristic is changed by at least locally changing a temperature of said protective film.

14. The method of claim 4, wherein said chemical mechanical polishing process comprises removal of a metal-containing material.

15. The method of claim 6, wherein lifting said portion of said protective film from said surface of said substrate by grasping said protective film with said vacuum gripper tool comprises contacting a surface portion of said protective film with said vacuum gripper tool.

16. The method of claim 6, wherein lifting said portion of said protective film from said surface of said substrate by grasping said at least one handle comprises grasping said at least one handle with a mechanical gripper.

17. The method of claim 9, wherein mechanically drawing off said protective film comprises removing at least some of said particle defects from said plurality of microstructure devices.

18. The method of claim 10, wherein exposing said protective film to at least one of a curing, heating, and radiation treatment imparts substantially foil-like characteristics thereto.

19. A method, comprising performing a deposition process to form a protective film comprising a polymer material layer above a plurality of microstructure devices formed in and above a surface of a semiconductor substrate at a first intermediate manufacturing stage corresponding to a manufacturing stage after a manufacturing process that creates particle defects on said plurality of microstructure devices;
exposing said protective film to at least one of a curing, heating, and radiation treatment prior to a second intermediate manufacturing stage;
removing said protective film from said surface of said semiconductor substrate at said second intermediate manufacturing stage, wherein removing said protective film comprises grasping and lifting at least a portion of said protective film near an edge portion of said semiconductor substrate.

20. The method of claim 19, wherein said deposition process comprises one of a spin-on deposition technique and a chemical vapor deposition technique.

21. The method of claim 19, wherein exposing said protective film to at least one of a curing, heating, and radiation treatment imparts substantially foil-like characteristics thereto.

22. A method, comprising:
performing a deposition process to form a protective film comprising a protective material layer above a substrate comprising a plurality of microstructure devices;
performing an electrical test on at least one of said plurality of microstructure devices by contacting at least one surface portion of said substrate with a probe through said protective film, wherein at least one material characteristic of said protective film is changed when contacting said at least one surface portion of said substrate; and
mechanically drawing off said protective film from said substrate after performing said electrical test by grasping and lifting at least a portion of said protective film near an edge portion of said substrate.

23. The method of claim 22, wherein particle defects are created on said protective film during said electrical test.

24. The method of claim 23, wherein mechanically drawing off said protective film from said substrate comprises removing at least some of said particle efects created during said electrical test.

* * * * *

UNITED STATES PATENT AND TRADEMARK OFFICE
CERTIFICATE OF CORRECTION

PATENT NO. : 7,955,962 B2  
APPLICATION NO. : 11/695657  
DATED : June 7, 2011  
INVENTOR(S) : Ralf Richter et al.

Page 1 of 1

It is certified that error appears in the above-identified patent and that said Letters Patent is hereby corrected as shown below:

Col. 16, line 58 (claim 24, line 3), delete "efects" and insert therefor -- defects --.

Signed and Sealed this  
Ninth Day of August, 2011

David J. Kappos  
*Director of the United States Patent and Trademark Office*